PRODUCTION OF AMPLITUDE MODULATED LIGHT BY
A SOLID STATE OSCILLATOR
Filed June 5, 1968

INVENTORS
MARTIN C. STEELE &
FRANCESCO PAOLO CALIFANO
BY Simon Yaffee
ATTORNEY

United States Patent Office 3,477,041

Patented Nov. 4, 1969

3,477,041

PRODUCTION OF AMPLITUDE MODULATED LIGHT BY A SOLID STATE OSCILLATOR

Martin C. Steele and Francesco Paolo Califano, Princeton, N.J., assignors to RCA Corporation, a corporation of Delaware Filed June 5, 1968, Ser. No. 734,726
Int. Cl. H01s 3/18
U.S. Cl. 332—7.51 8 Claims

ABSTRACT OF THE DISCLOSURE

A three terminal GaAs microwave oscillator is biased to generate amplitude-modulated light. Whenever the amplitude of the radio frequency oscillations biases a portion of the p-n junction sufficiently forwardly, a coherent light pulse is emitted from the junction.

BACKGROUND

A three terminal GaAs microwave oscillator is known which comprises a small block of GaAs, about one half of which is negatively doped and the remainder of which is positively doped, whereby a p-n junction appears in the block. A kerf is provided in the block extending perpendicularly to the junction and penetrating the negatively doped portion of the block to a distance which is short of the junction. An electrode is applied to the uncut face of the block that is parallel to the junction, and an electrode is applied to each portion of the cut face that is parallel to the junction. Energizing voltages are applied between the last mentioned two electrodes. In such a microwave oscillator, variation in a biasing voltage which is applied between the first electrode and one of the other electrodes results in modulation of the frequency of the oscillations provided by the oscillator.

SUMMARY

This invention is based on the fact that it has been discovered that whenever the amplitude of the radio frequency oscillations produced by the three terminal microwave oscillator is so great as to bias a portion of the p-n junction positive, light is emitted from that portion of the junction. Since a portion of the p-n junction is biased positively during only part of each cycle of the produced wave, the light goes on only during a portion of each cycle and goes off during the remainder of the cycle. As the frequency or the amplitude of the oscillations is changed, as by frequency or amplitude modulation of the waves produced by the oscillator, the light output is varied in pulse width and intensity. High voltage forward biasing of the p-n junction will produce lasing action by the three terminal solid state oscillator.

BRIEF DESCRIPTION OF THE DRAWING

The invention will be better understood upon reading the following description in connection with the accompanying drawing in which.

DESCRIPTION

Figure 1:
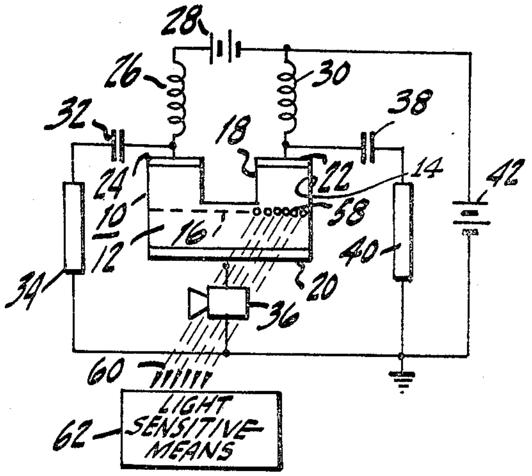
FIGURE 1 is a circuit diagram of an oscillator including an embodiment of this invention, FIGURE 2 comprises a number of curves which are useful in explaining the operation of the device of FIGURE 1.

As illustrated in FIGURE 1, a block 10 of semiconductive material such as gallium arsenide (GaAs) is provided. The lower portion 12 (as viewed in FIGURE 1) of the block 10 is doped with a material such as zinc to provide p material. The remainder 14 of the block 10 is doped with a material such as silicon to provide n material, whereby a p-n junction 16 appears in the block 10. A kerf 18 is formed in the upper or n portion 14 of the block 10, the kerf 18 is extending downwardly nearly to the junction 16, that is to within a distance of a few microns from the junction 16. The kerf may be made by a saw or by etching or in any convenient manner. The width of the kerf 18 is not critical. The bottom of the kerf 18 extends parallelly with respect to the junction 16. Electrode 20 is applied to the bottom of the block 10 and an electrode 22 is applied to the top of one of the raised surfaces of the upper portion 14 produced by the kerf 18. A third electrode 24 is applied to the other of the raised surfaces comprising the portion 14. A choke coil 26, a source 28 of operating voltage and a second choke coil 30 are connected between the electrodes 22 and 24. A blocking capacitor 32, a tuning reactor 34 and a microphone 36 are connected between the electrodes 20 and 24. A blocking capacitor 38 and a second reactor 40 are connected across the electrodes 20 and 22 in series with the microphone 36. A biasing voltage source 42 is connected between the electrodes 20 and 22 by way of the choke coil 30 and the microphone 36. The junction of the microphone 36 and the reactor 40 is grounded as shown. The voltages of the sources 28 and 42 are of the same polarity in the circuit traced between electrodes 20 and 24. The source 42 is poled to reversely bias the junction 16. While the polarity of the supply voltage 28 with respect to the electrodes 22 and 24 is unimportant, as will be noted only the portion of the p-n junction 16 that becomes forward biased will emit light. If desired, a variable impedance may be substituted for the resistance microphone 36.

The circuit so far described will oscillate at a frequency depending on the values of the reactors 34 and 40 and on the capacity of the space charge provided by the p-n junction 16. The reactors 34 and 40 may be of the lumped type for production of low frequencies and of the distributed type for the production of high frequencies. By changing the voltage of the source 42 or the impedance of the microphone 36, the electron-hole pairs in the p-n junction 16 will be varied to vary its accompanying space charge and therefore to vary the frequency of the oscillations provided by the described oscillator.

Figure 2:
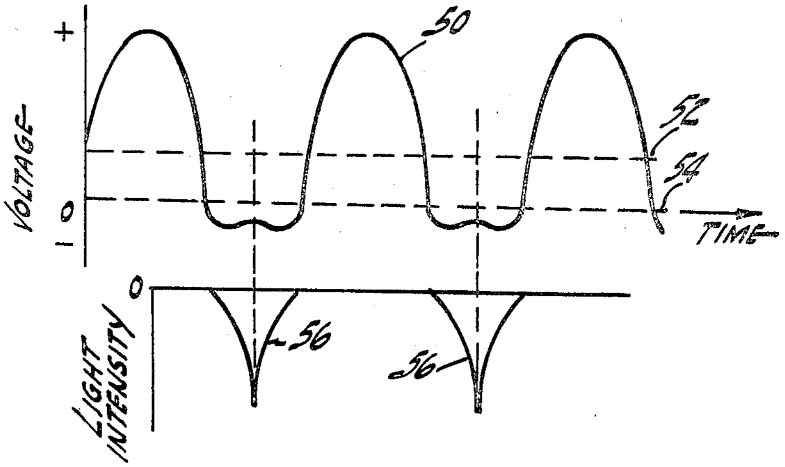

As the voltage of the oscillations produced by the described three terminal solid state oscillator increases in amplitude, a point will be reached where a part of the p-n junction 16 (the part between electrodes 22 and 20) is biased positively during a portion of each cycle of the produced oscillations, as indicated in FIGURE 2. In FIGURE 2, the reference character 50 indicates the voltage of the cycles of oscillations produced by the described oscillator when plotted against time. The dotted line 52 indicates the voltage across the p-n junction as provided solely by the battery 42. The dotted line 54 represents zero voltage across the p-n junction 16, and therefore the portion of the wave 50 that is below the dotted line 54 indicates that portion of the cycle of produced oscillations during which the p-n junction 16 is forwardly biased. The curve 56 indicates the intensity of the light 60 (see FIGURE 1) that is emitted from the forward biased portion of the p-n junction, that is from the edge of the body 10 in the region of the p-n junction 16 between the electrodes 22 and 20 as indicated by the circles 58. The intensity of the light 60 increases to a maximum intensity at the middle of the period when the p-n junction is positively biased and decreases to zero at the end of this period, as indicated by the curves 56 in FIGURE 2. During the positively biased period, since the forward conductivity of the p-n junction increases rapidly, the voltage of the negative half cycle of the produce r-f wave is clipped. The current flow across the junction 16 increases during the negatively biased period until the center of the period and then decerases. The flow of current across the p-n junction 16 is accompanied by the production of light 60.

Upon decrease of the amplitude of the oscillations 50, the duration of the light as well as its amplitude will be decreased, until no light is produced when the p-n junction 16 is no longer positively biased. Upon increase of the amplitude of the oscillations 50, a point will be reached where light 60 will be produced at the p-n junction. Upon change of the frequency of the oscillations 50, the duration of the periods during which the p-n junction 16 is forwardly biased and the frequency of these periods will change. The light 60 provided by the described three terminal oscillator may be applied to a light sensitive means 62 whereby any signal applied to the microphone 36 may be reproduced by the means 62 and whereby a message may be transmitted to a distant point by the light 60 which is modulated in intensity. Since the means 62 as illustrated in FIG. 1 may be in line with the p-n junction 16, the illustration of the light 60 and of the position of the means 62 is distorted for clearness of illustration.

Figure 3:
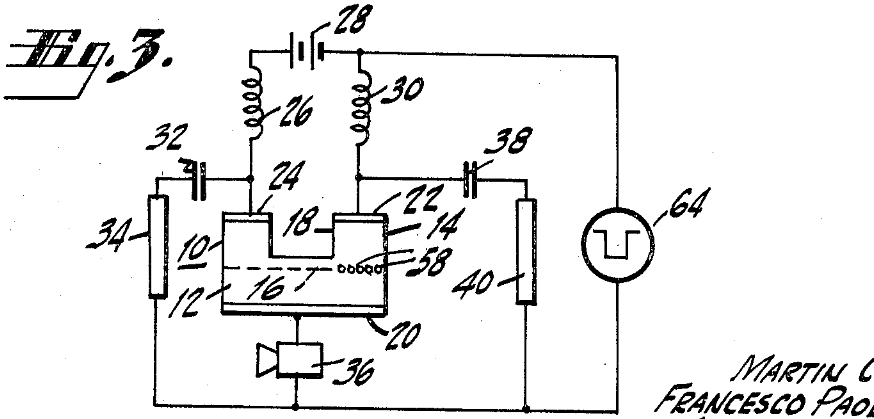
FIGURE 3 is a circuit diagram of an oscillator which will produce coherent light.

FIG. 3 differs from FIG. 1 only in that a high enough source of voltage 64 is substituted for the source 42 of FIG. 1 to produce lasing action in the circuit of FIG. 3. Therefore all other elements of FIG. 3 have been given the same reference characters as the corresponding portions of FIG. 1 and no further explanation thereof appears necessary.

The polarity of the pulses source 64 is such as to forwardly bias the junction 16. The voltage of the source 64 is high enough so that the current flowing through the p-n junction 16 is about at the threshold of producing coherent light, that is on the threshold of lasing action. The oscillations produced by the oscillator comprising the block 10 and its circuit add to and subtract from the current flow through the junction 16 caused by the source 64 whereby the lasing action is modulated by the produced waves. A pulsed source 64 is used instead of a continuous source since the heat produced in the block 10 may destroy it if the source 64 were continuous. However with proper cooling, a continuous source may be used in place of the source 64. As before, the produced oscillations will be modulated by the microphone 36 and the light emitted from the junction 16 in the vicinity of the circles 58 will be modulated in intensity and may be applied to a light sensitive means to transmit a message.

Many modifications of the above described light producing apparatus will occur to a person skilled in the art. For example, the block 10 may consist of an alloy GaAs plus GaP which emits light in the visible range. The described oscillator may operate either in a continuous wave mode or in a pulsed wave mode. Therefore the above description is to be taken as illustrative and not in a limiting sense.

What is claimed is:

1. In combination, a three terminal solid state oscillator which includes a p-n junction, and
means to cause said oscillator to produce oscillations at such amplitude that said p-n junction is forward biased to produce light emission from said junction area.

2. The invention as expressed in claim 1 in which said solid state oscillator comprises a block of gallium arsenide which includes said p-n junction.

3. The invention as described in claim 1 in which means are provided to vary the frequency of the oscillations produced by said oscillator whereby the produced light is modulated in intensity.

4. The invention as expressed in claim 1 in which high enough voltage is applied across said p-n junction to cause current to flow therein of an amount to cause said junction to be at least at the threshold of laser action whereby modulated coherent light is produced by said light producing device.

5. In combination,
a block of semi-conductor material having opposed surfaces,
a portion of said block being doped to provide negative type material,
another portion of said block being doped to provide positive type material, whereby a p-n junction exists in said block between said surfaces,
there being a kerf in said negative portion of said block extending transversely of said p-n junction and terminating short thereof, and
circuit means connected to said surfaces to cause oscillations to occur in said block of amplitude sufficiently great to cause said p-n junction to be forward biased to produce the emission of light from said p-n junction area.

6. The invention as described in claim 4 in which said block is of gallium arsenide.

7. The invention as described in claim 4 in which means are provided to vary the frequency of the oscillations produced by said oscillator whereby the produced light is modulated in intensity.

8. The invention as described in claim 4 in which high enough voltage is applied across said p-n junction to cause current to flow therein of an amount to cause said junction to be at least at the threshold of laser action whereby modulated coherent light is produced by said light producing device.

References Cited

UNITED STATES PATENTS 3,102,201 8/1963 Braunstein et al. ----- 332—7.51

RODNEY D. BENNETT, Jr., Primary Examiner
CHARLES E. WANDS, Assistant Examiner

U.S. Cl. X.R.

307—312; 331—90.5